United States Patent
Nakashima et al.

(10) Patent No.: US 12,398,461 B2
(45) Date of Patent: Aug. 26, 2025

(54) SUBSTRATE CLEANING APPARATUS AND SUBSTRATE CLEANING METHOD

(71) Applicant: Tokyo Electron Limited, Tokyo (JP)

(72) Inventors: Tsunenaga Nakashima, Koshi (JP); Masami Akimoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 512 days.

(21) Appl. No.: 17/755,449

(22) PCT Filed: Oct. 19, 2020

(86) PCT No.: PCT/JP2020/039244
§ 371 (c)(1),
(2) Date: Apr. 29, 2022

(87) PCT Pub. No.: WO2021/085212
PCT Pub. Date: May 6, 2021

(65) Prior Publication Data

US 2022/0389574 A1   Dec. 8, 2022

(30) Foreign Application Priority Data

Nov. 1, 2019   (JP) .................................. 2019-200157

(51) Int. Cl.
*C23C 16/44*   (2006.01)
*C23C 16/455*   (2006.01)
(Continued)

(52) U.S. Cl.
CPC .... *C23C 16/4405* (2013.01); *C23C 16/45519* (2013.01); *H01L 21/67051* (2013.01); *H01L 21/68735* (2013.01)

(58) Field of Classification Search
CPC ......... H01L 21/67028; H01L 21/02046; H01L 21/02057; H01L 21/68735;
(Continued)

(56) References Cited

U.S. PATENT DOCUMENTS 9,691,641 B2 *  6/2017  Huang ...................... B08B 3/04
9,738,977 B1 *  8/2017  Karim ............... H01L 21/02126
(Continued)

FOREIGN PATENT DOCUMENTS

JP    H03-209741 A   9/1991
JP    H04-206521 A   7/1992
(Continued)

OTHER PUBLICATIONS

Machine translation of JP-10056004-A (Year: 1998).*
International Search Report for PCT/JP2020/039244 dated Dec. 15, 2020.

*Primary Examiner* — Michael E Barr
*Assistant Examiner* — Thomas Bucci
(74) *Attorney, Agent, or Firm* — Chrisman Gallo Tochtrop LLC (57) ABSTRACT

A particle removed from a substrate is suppressed from adhering to the substrate again. A substrate cleaning apparatus includes a substrate holder configured to hold the substrate; a gas nozzle configured to jet a cleaning gas to the substrate on the substrate holder; and a nozzle cover provided to surround the gas nozzle. The cleaning gas is jetted to a decompression chamber of the nozzle cover from the gas nozzle, and a gas cluster configured to remove the particle on the substrate in the decompression chamber is generated. A gas for a gas curtain is jetted from a holder support of the substrate holder toward the nozzle cover, and the gas curtain is formed between the nozzle cover and the holder support.

8 Claims, 9 Drawing Sheets

(51) Int. Cl.
*H01L 21/67* (2006.01)
*H01L 21/687* (2006.01)

(58) Field of Classification Search
CPC ......... H01L 21/67196; H01L 21/68764; B05B 1/005; B05B 1/28; B05B 12/18; B05B 14/30; B05B 1/044; B05B 9/03; B08B 5/02; B08B 13/00
USPC ........................................................ 134/198
See application file for complete search history.

(56) References Cited

U.S. PATENT DOCUMENTS

| | | | |
|---|---|---|---|
| 9,881,815 B2 * | 1/2018 | Matsuo | H01L 21/02046 |
| 10,202,691 B2 * | 2/2019 | Karim | H01J 37/32513 |
| 11,020,774 B2 * | 6/2021 | Mbanaso | H01L 21/67051 |
| 2006/0081174 A1 * | 4/2006 | Baran | B05B 14/10 |
| | | | 118/326 |
| 2007/0283983 A1 * | 12/2007 | Park | B08B 3/02 |
| | | | 134/147 |
| 2012/0214290 A1 * | 8/2012 | Sugaya | H01L 21/67092 |
| | | | 438/455 |
| 2014/0166055 A1 * | 6/2014 | Huang | B08B 3/04 |
| | | | 134/33 |
| 2015/0007858 A1 * | 1/2015 | Matsuo | H01L 21/02046 |
| | | | 156/345.24 |
| 2015/0027501 A1 * | 1/2015 | Dobashi | H01L 21/67028 |
| | | | 15/303 |
| 2017/0323823 A1 * | 11/2017 | Si | H01L 21/67115 |
| 2017/0338131 A1 * | 11/2017 | Amahisa | B08B 3/08 |
| 2017/0362713 A1 * | 12/2017 | Karim | C23C 16/458 |
| 2019/0255580 A1 * | 8/2019 | Mbanaso | H01L 21/67051 |
| 2019/0300999 A1 * | 10/2019 | Yamaguchi | C23C 4/02 |
| 2019/0360318 A1 * | 11/2019 | Min | E21B 10/61 |
| 2020/0161124 A1 * | 5/2020 | Siefering | B08B 3/02 |
| 2020/0227253 A1 * | 7/2020 | Park | H01L 21/67115 |
| 2021/0175098 A1 * | 6/2021 | Iwao | H01L 21/0206 |

FOREIGN PATENT DOCUMENTS

| | | | |
|---|---|---|---|
| JP | 10056004 A | * | 2/1998 |
| JP | 2000-054137 A | | 2/2000 |
| JP | 2007-036121 A | | 2/2007 |
| JP | 2007-201374 A | | 8/2007 |
| JP | 2013-175681 A | | 9/2013 |
| JP | 2015-026745 A | | 2/2015 |
| JP | 6311236 B2 | | 4/2018 |

\* cited by examiner

SUBSTRATE CLEANING APPARATUS AND SUBSTRATE CLEANING METHOD

CROSS-REFERENCE TO RELATED APPLICATIONS

This Application is a U.S. national phase application under 35 U.S.C. § 371 of PCT Application No. PCT/JP2020/039244 filed on Oct. 19, 2020, which claims the benefit of Japanese Patent Application No. 2019-200157 filed on Nov. 1, 2019, the entire disclosures of which are incorporated herein by reference.

TECHNICAL FIELD

The various aspects and embodiments described herein pertain generally to a substrate cleaning apparatus and a substrate cleaning method.

BACKGROUND

In a semiconductor manufacturing apparatus, adhesion of particles to a substrate during a manufacturing process is one of major factors that decide the yield of products. For this reason, the substrate is cleaned before or after it is subjected to a processing. In this regard, it is required to develop a cleaning technique enabling to remove particles reliably by a simple method while suppressing damage to the substrate. Various cleaning techniques have been researched and developed to peel the particles from a surface of the substrate by applying a physical shearing force equal to or larger than the adhesive strength between the particles and the substrate. One of these techniques is a technique using a physical shearing force of a gas cluster.

The gas cluster is an aggregate (cluster) in which a large number of atoms or molecules are aggregated when a high-pressure gas is jetted into a vacuum formed in a decompression chamber or the like to be cooled to a condensation temperature by adiabatic expansion. When cleaning the substrate, the particles are removed by radiating the gas cluster to the substrate while appropriately accelerating it or without accelerating it.

Further, conventionally, a technique for effectively removing particles attached in a pattern on the surface of the substrate has been developed (see Patent Document 1).

In this case, if the particles removed from the substrate can be suppressed from being wound up and re-adhering to the substrate, the substrate can be cleaned more effectively.
Patent Document 1: Japanese Patent Laid-open Publication No. 2013-175681

SUMMARY

In an exemplary embodiment, a substrate cleaning apparatus includes a substrate holder configured to hold a substrate; a nozzle cover equipped with a decompression chamber configured to form a decompressed atmosphere with respect to the substrate; and a gas nozzle configured to jet a cleaning gas having a pressure higher than that of the decompression chamber to generate, in the decompression chamber, a gas cluster configured to clean the substrate. The nozzle cover comprises a nozzle cover main body equipped with the decompression chamber and a flange provided at a lower end periphery of the nozzle cover main body. The substrate holder is provided with a gas curtain forming unit configured to form a gas curtain by jetting a gas for the gas curtain to the flange.

DETAILED DESCRIPTION

Exemplary Embodiment

Figure 7:
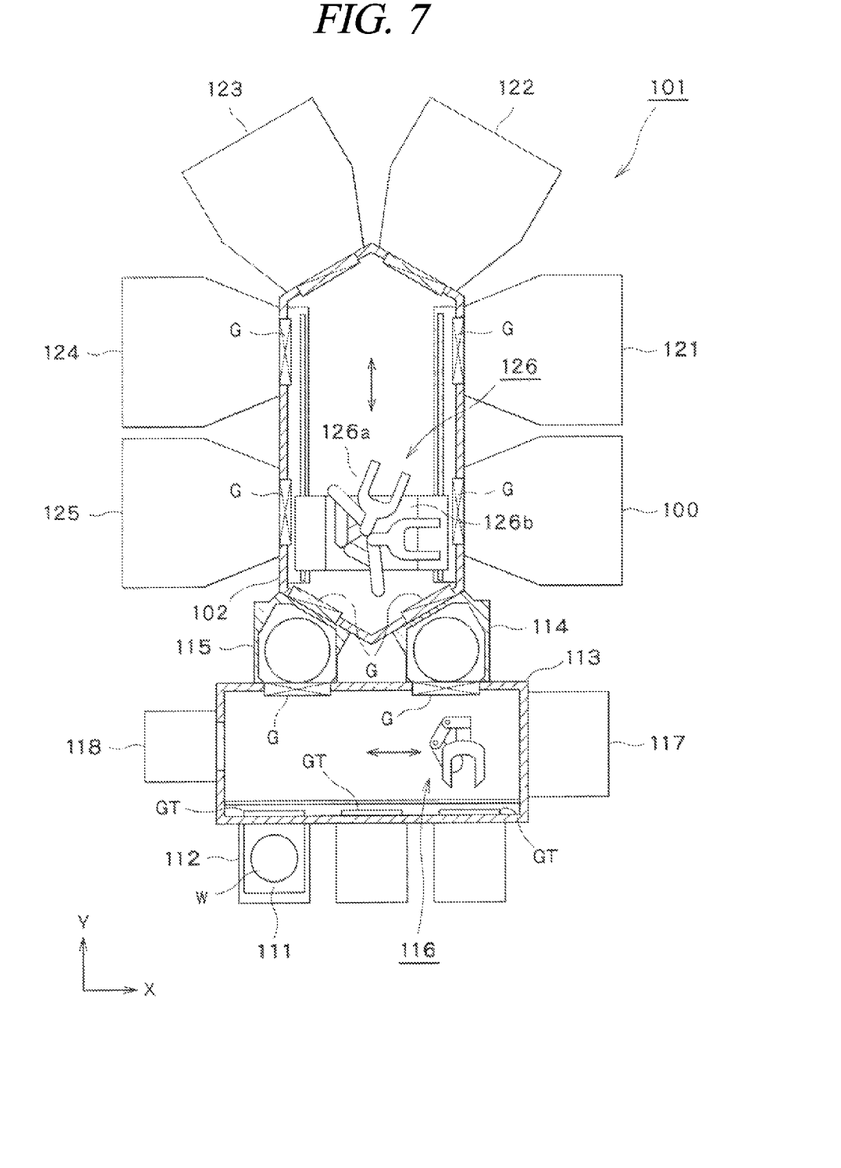
FIG. 7 is a diagram illustrating an entire vacuum processing apparatus in which the substrate cleaning apparatus is provided.

First, an entire vacuum processing apparatus equipped with a substrate cleaning apparatus according to an exemplary embodiment will be described with reference to FIG. 7. FIG. 7 is a plan view showing an overall configuration of a vacuum processing apparatus 101 which is a multi-chamber system. In the vacuum processing apparatus 101, carry-in/out ports 112 each configured to place thereon a FOUP 111 as a sealed transfer container in which, for example, twenty five sheets of semiconductor wafers (hereinafter referred to as "wafers") W as substrates are accommodated are arranged side by side in a transversal direction at, for example, three locations. Further, an atmospheric transfer chamber 113 is provided along the arrangement of these carry-in/out ports 112, and a gate door GT configured to be opened or closed along with a cover of the FOUP 111 is provided on a front wall of the atmospheric transfer chamber 113.

Two load lock chambers 114 and 115, for example, are airtightly connected to the atmospheric transfer chamber 113 on the opposite side to the carry-in/out ports 112. A vacuum pump (not shown) and a leak valve (not shown) are provided in each of these load lock chambers 114 and 115 to perform a switchover between a normal pressure atmosphere and a vacuum atmosphere. Further, in FIG. 10, gate valves (sluice valves) G are provided. Moreover, the atmospheric transfer chamber 113 is provided with a first substrate transfer device 116 composed of a multi-joint arm for transferring the wafer W. Further, when viewed from the front side to the rear side of the atmospheric transfer chamber 113, a wafer inspection unit 117 serving as a substrate inspection unit is provided on a right wall of the atmospheric transfer chamber 113, and an alignment chamber 118 configured to adjust direction and eccentricity of the wafer W is provided on a left wall of the atmospheric transfer chamber 113. The first substrate transfer device 116 serves to transfer the wafer W to/from the FOUP 111, the load lock chambers 114 and 115, the wafer inspection unit 117, and the alignment chamber 118. For this reason, the first substrate transfer device 116 is configured to be movable in, for example, the arrangement direction (X direction in FIG. 1) of the FOUPs 111, movable up and down, rotatable about a vertical axis, and movable back and forth.

When viewed from the atmospheric transfer chamber 113, a vacuum transfer chamber 102 is hermetically connected to the back side of the load lock chambers 114 and 115. This vacuum transfer chamber 102 is connected with five vacuum processing modules 121 to 125 and a substrate cleaning apparatus 100 according to the present exemplary embodiment. The vacuum processing modules 121 to 125 are configured as vacuum processing modules configured to perform a sputtering processing and a CVD (Chemical Vapor Deposition) processing for film formation including copper wiring on the wafer W having, as recesses for a circuit pattern formation, via holes and grooves for burying the copper wiring.

Further, the vacuum transfer chamber 102 is equipped with a second substrate transfer device 126 configured to transfer the wafer W in the vacuum atmosphere, and the wafer W is transferred to/from the load lock chambers 114 and 115, a substrate cleaning apparatus 100, and the vacuum processing modules 121 to 125 by the second substrate transfer device 126. The second substrate transfer device 126 is equipped with a multi-joint arm 126a configured to be rotatable about a vertical axis and movable back and forth, and this multi-joint arm 126a is configured to be moved in a lengthwise direction (Y direction in FIG. 1) by a base 126b.

Next, the wafer inspection unit 117 will be explained. The wafer inspection unit 117 is configured to acquire particle information including a particle diameter for a particle adhering to the wafer W. The particle information is information for detecting, for example, a position and a size of the particle on the wafer W. An apparatus capable of evaluating the particle diameter of the particle on the surface of the wafer, for example, an optical or electron beam type surface defect inspection apparatus using specular reflection light or scattered light may be used as the wafer inspection unit 117. Alternatively, a scanning probe microscope such as a scanning electron microscope (SEM), a scanning tunnel microscope (STM), or an atomic force microscope (AFM) may be used.

Now, the substrate cleaning apparatus 100 according to the present exemplary embodiment will be described. The substrate cleaning apparatus 100 is configured to remove a deposit adhering to the wafer W accommodated therein.

Figure 1:
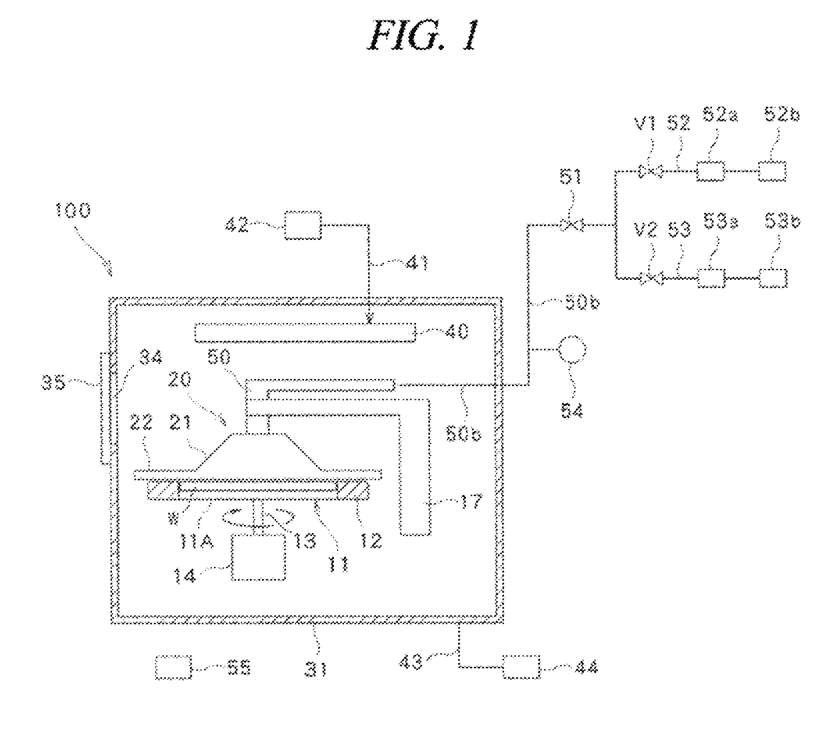
FIG. 1 is a side view illustrating a substrate cleaning apparatus according to an exemplary embodiment.
Figure 2:
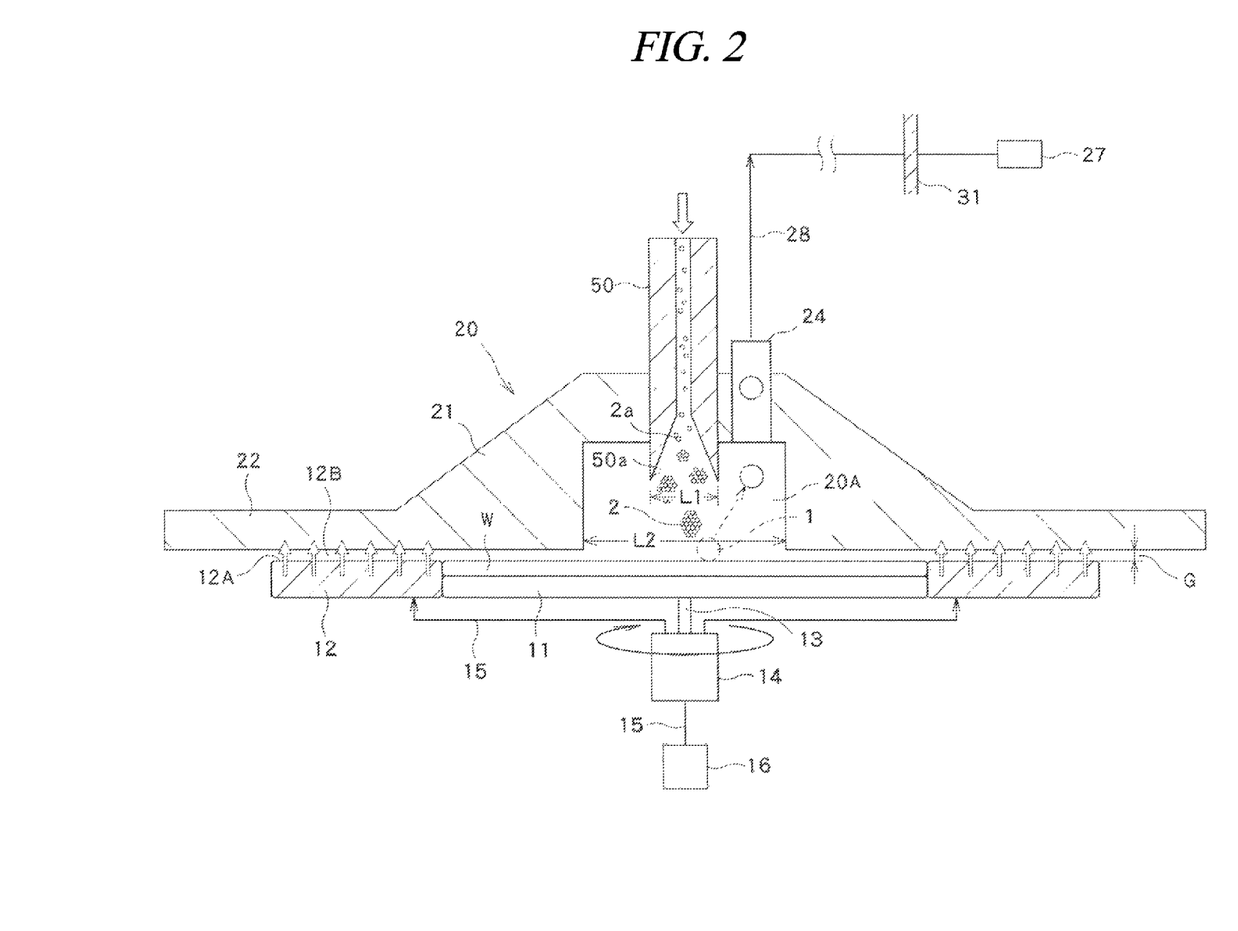
FIG. 2 is a side view illustrating a gas nozzle and a nozzle cover of the substrate cleaning apparatus shown in FIG. 1.
Figure 3:
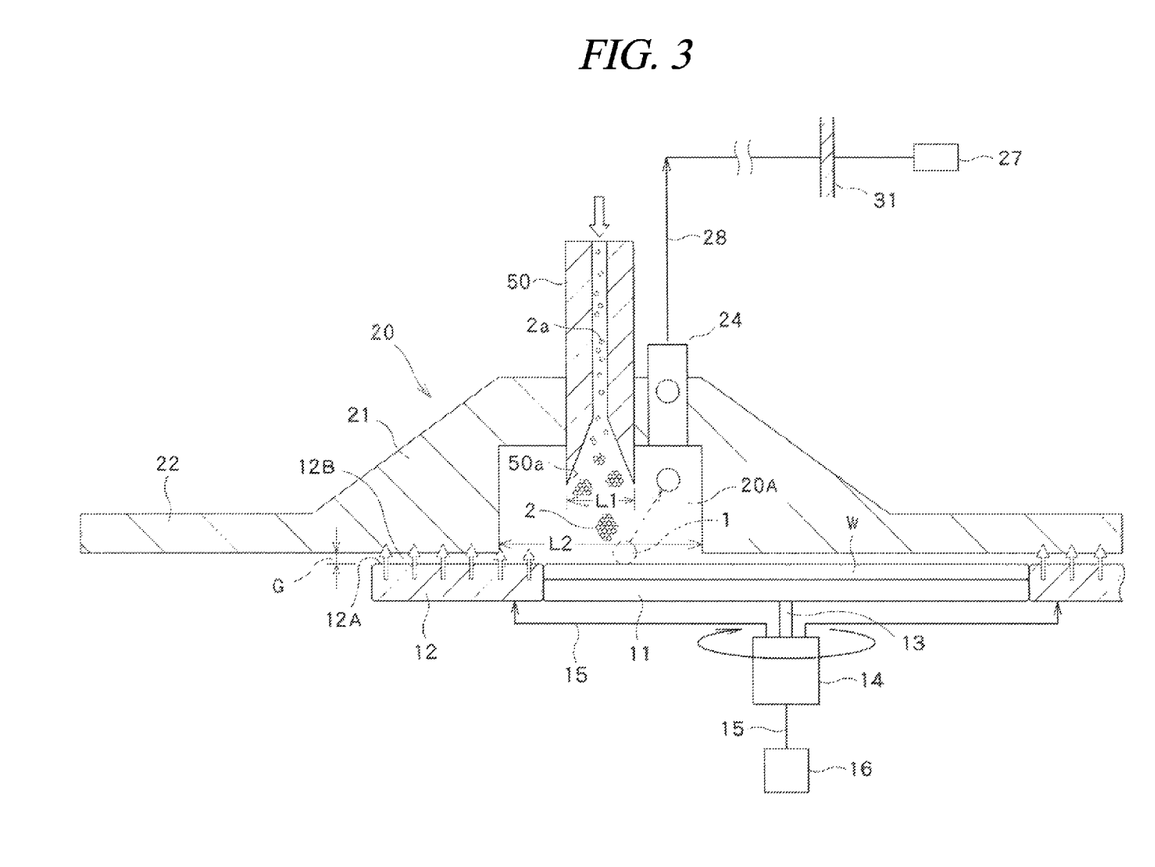
FIG. 3 is a side view illustrating an operation of the substrate cleaning apparatus.

As depicted in FIG. 1 to FIG. 3, the substrate cleaning apparatus 100 includes: a cleaning chamber 31; a substrate holder 11 disposed in the cleaning chamber 31 and configured to hold the wafer W, which is placed thereon horizontally, in a rotatably manner; a gas nozzle 50 configured to jet a cleaning gas to the wafer W on the substrate holder 11; and a nozzle cover 20 surrounding the gas nozzle 50 and equipped with a decompression chamber 20A in which a decompressed atmosphere is formed with respect to the wafer W.

Among these, the cleaning chamber 31 is formed to have a positive pressure with respect to the exterior air. A clean gas supply 40 configured to supply a clean gas is provided at an upper portion of the cleaning chamber 31, and this clean gas supply 40 is connected to a gas source 42 via a gas supply line 41.

Further, a gas exhaust device 44 such as an exhaust fan is connected to a lower portion of the cleaning chamber 31 via a gas exhaust line 43. In addition, an opening 34 for carry-in or carry-out of the wafer W is provided at a sidewall of the cleaning chamber 31, and the opening 34 is hermetically sealed so as to be opened or closed by a gate 35.

Further, the substrate holder 11 is equipped with a holder main body 11A configured to hold the wafer W placed thereon horizontally, and a holder support 12 disposed around the holder main body 11A to surround the wafer W from a lateral side thereof. The holder main body 11A and the holder support 12 can be rotated as one body via a driving shaft 13 which is driven by a driving motor 14.

Further, the gas nozzle 50 is configured to jet a carbon dioxide ($CO_2$) gas and a helium (He) gas to the wafer W as will be described later, and the nozzle cover 20 is provided so as to surround this gas nozzle 50.

Specifically, as shown in FIG. 1 to FIG. 3, the nozzle cover 20 has an inverted cup shape, and includes a nozzle cover main body 21 having the decompression chamber 20A therein and a flange 22 extending from a lower end periphery of the nozzle cover main body 21. The gas nozzle 50 is mounted to this cup-shaped nozzle cover main body 21 so that it passes through a central portion of the nozzle cover main body 21.

The nozzle cover main body 21 and the flange 22 of the nozzle cover 20 are formed as one body, and are made of ceramic as a whole.

Further, the nozzle cover 20 composed of the nozzle cover main body 21 and the flange 22 is provided so as to cover the entire region of the wafer W.

Particularly, as will be described later, the nozzle cover 20 is configured to be movable with respect to the wafer W by a moving arm 17. In the meanwhile, the decompression chamber 20A of the nozzle cover 20 is moved from a center of the wafer W to a periphery thereof. In this case, while the decompression chamber 20A is being moved from the center of the wafer W to the periphery thereof, the nozzle cover 20 can cover the entire region of the wafer W all the time. Accordingly, a particle removed from the wafer W is suppressed from being scattered to the outside of the nozzle cover 20.

Further, in the substrate holder 11, an end portion 12A of the holder support 12 on the nozzle cover 20 side is provided with jetting holes through which a gas for gas curtain such as a $N_2$ gas or air supplied from a gas flow path 15 to be described later is jetted toward the nozzle cover 20. For example, by allowing the holder support 12 of the substrate holder 11 to be made of a porous material, the end portion 12A of the holder support 12 on the nozzle cover 20 side is provided with a large number of holes, and these holes are used as the jetting holes through which the gas for gas curtain is jetted toward the nozzle cover 20. Thus, the holes at the end portion 12A of the holder support 12 on the nozzle cover 20 side serve as a gas curtain forming unit configured to form a gas curtain between the holder support 12 and the nozzle cover 20.

Figure 8:
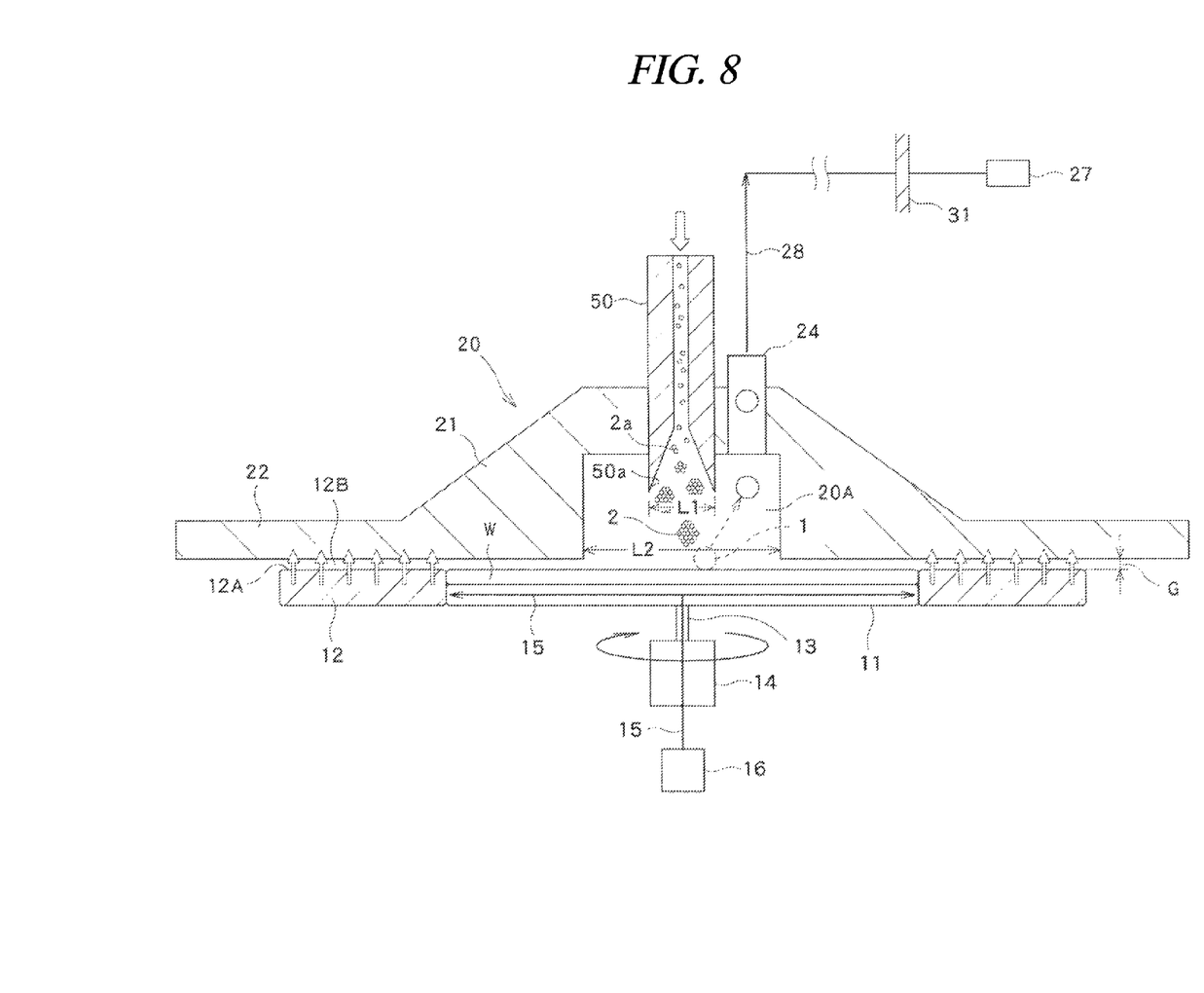
FIG. 8 is a diagram illustrating a modification example of a gas flow path, and is similar to FIG. 2.

Further, the gas for gas curtain composed of the $N_2$ gas or the air is supplied to the holder support 12 through the gas flow path 15 connected to a gas source 16 for gas curtain. The gas flow path 15 may be directly provided from the driving shaft 13 to the holder support 12, as shown in FIG. 2, or may be configured to pass through the inside of the substrate holder 11 and the driving shaft 13 formed to be hollow, as illustrated in FIG. 8.

Further, in the nozzle cover main body 21 of the nozzle cover 20, a decompression unit 24 configured to form the decompressed atmosphere in the decompression chamber 20A of the nozzle cover 20 is provided adjacent to the gas nozzle 50, and this decompression unit 24 is connected to a decompression pump 27 via a connection line 28. In this case, the connection line 28 is extended through a wall of the cleaning chamber 31 and led to the decompression pump 27 provided outside the cleaning chamber 31.

Further, the gas nozzle 50 is held by the nozzle cover main body 21 of the nozzle cover 20, and this gas nozzle 50 is horizontally moved in the cleaning chamber 31 along with the nozzle cover 20 by a moving arm 17 which is disposed in the cleaning chamber 31. In the present exemplary embodiment, the gas nozzle 50 and the nozzle cover 20 are configured to be movable, above the wafer W held by the substrate holder 11, from a center of the wafer W toward a periphery thereof or from the periphery of the wafer W toward the center thereof by the moving arm 17.

In addition, an outlet 50a side of the gas nozzle 50 is enlarged in diameter. An outer diameter L1 of a leading end of the outlet 50a is set to be, e.g., 10 mm, and an outer diameter L2 of the end portion of the decompression chamber 20A of the nozzle cover 20 on the wafer W side is set to be, e.g., 50 mm to 60 mm.

As shown in FIG. 1 to FIG. 3, the substrate holder 11 configured to hold the wafer W is equipped with the holder main body 11A, and the holder support 12 disposed around the holder main body 11A to surround the wafer W from the lateral side thereof. Here, the holder main body 11A is made of the SUS material, aluminum material or ceramic material, and has a high surface friction coefficient. Accordingly, just by placing the wafer W on the holder main body 11A, the wafer W can be stably held on the holder main body 11A without needing to provide an attraction mechanism.

Moreover, it is desirable that the holder support 12 is made of a porous material such as ceramic and a top surface of the holder support 12 is on a level with a top surface of the holder main body 11A. In this case, the porous material such as the ceramic may be exposed only in a portion of the holder support 12 facing the flange 22 of the nozzle cover 20, whereas the other portions of the holder main body 11A may be coated or a non-porous material may be stuck thereto. In this case, the gas for gas curtain may be supplied from the portion of the holder support 12 facing the flange 22. Still alternatively, the holder support 12 may be made of a SUS material or an aluminum material instead of the ceramic material. The holder support 12 may be formed by machining the ceramic material, the SUS material, or the aluminum material.

Further, as shown in FIG. 1, one end of a connection line 50b extending through the wall of the cleaning chamber 31 is connected to the gas nozzle 50. In the cleaning chamber 31, the connection line 50b has a flexible structure so it is capable of coping up with a movement of the gas nozzle 50. In addition, the connection line 50b is connected to a supply path 52 for a carbon dioxide ($CO_2$) gas and a supply path 53 for a helium (He) gas via a pressure control valve 51 which constitutes a pressure controller at the outside of the cleaning chamber 31. The supply path 52 has an opening/closing valve V1, a carbon dioxide gas flow rate controller 52a, and a carbon dioxide gas source 52b, and the supply path 53 has an opening/closing valve V2, a helium gas flow rate controller 53a, and a helium gas source 53b.

The carbon dioxide gas is a gas for cleaning (cleaning gas), and a gas cluster is formed by this gas. Further, the helium gas is a gas for pushing out (extruding gas). The helium gas is difficult to form the cluster, and if the helium gas is mixed into the carbon dioxide gas, the speed of the cluster generated by the carbon dioxide gas can be increased. Further, the connection line 50b is provided with a pressure detector 54 configured to detect a pressure within the connection line 50b. Based on a detection value of this pressure detector 54, the opening degree of the pressure control valve 51 is adjusted by a controller 55 to be described later, so that a gas pressure within the decompression chamber 20A is controlled.

In addition, based on the detection value of the pressure detector 54, the controller 55 may control the carbon dioxide gas flow rate controller 52a and the helium gas flow rate controller 53a to adjust flow rates of the gases. Further, a supply pressure of each gas may be increased by using a pressure raising mechanism such as a gas booster between the opening/closing valves V1 and V2 for the gases and the control valve 51, and may be adjusted by the pressure control valve 51.

Moreover, as shown in FIG. 1 and FIG. 3, the vacuum processing apparatus 101 is provided with the controller 55 composed of, for example, a computer for controlling an overall operation of the whole apparatus. The controller 55 includes a CPU, a program, and a storage. The program has process groups created to implement an operation of the apparatus corresponding to a vacuum processing performed in the vacuum processing modules 121 to 125 in addition to a cleaning processing to be described later. The program is stored in a recording medium such as, but not limited to, a hard disk, a compact disk, a magneto-optical disk, a memory card or a flexible disk, and is installed from this recording medium to the controller 55.

Further, the particle information acquired by the wafer inspection unit 117 is stored in the storage of the controller 55. This particle information is information in which the position of the wafer W and the size of the particle are matched. The size of the particle is, for example, a value assigned according to the range of particle diameters set in the wafer inspection unit 117, and the size is determined by values such as equal to or larger than 20 nm and less than 40 nm, or equal to or larger than 40 nm and less than 60 nm.

Now, an operation of the present exemplary embodiment having the above-described configuration will be discussed.

If the FOUP 111 is disposed in the carry-in/out port 112 shown in FIG. 7, the wafer W is taken out from the FOUP 111 by the first substrate transfer device 116. This wafer W has, as pattern recesses, recesses (grooves and via holes) for burying a copper wiring. Then, the wafer W is transferred to the alignment chamber 118 via the atmospheric transfer chamber 113 in the normal pressure atmosphere to be aligned. Thereafter, the wafer W is transferred to the wafer inspection unit 117 by the first substrate transfer device 116, and the particle information is acquired therein. The acquired particle information is sent to the controller 55.

The wafer W after being subjected to the inspection in the wafer inspection unit 117 is carried by the first substrate transfer device 116 into the load lock chamber 114 (115) set to be in the normal pressure atmosphere. Then, after the atmosphere within the load lock chamber 114 (115) is switched to the vacuum atmosphere, the wafer W is transferred to the substrate cleaning apparatus 100 by the second substrate transfer device 126 to be subjected to a particle removal processing.

As depicted in FIG. 1 to FIG. 3, in the substrate cleaning apparatus 100, the gas for gas curtain such as the $N_2$ gas or the air supplied through the gas flow path 15 is first jetted to the nozzle cover 20 from the end portion of the holder support 12 of the substrate holder 11 on the nozzle cover 20 side (see FIG. 1). The gas for gas curtain jetted to the nozzle cover 20 forms a gas curtain 20B between the holder support 12 and the flange 22 of the nozzle cover 20, and seals between the inside of the decompression chamber 20A of the nozzle cover 20 and the outside.

In the meantime, the decompression pump 27 is operated, and the decompression chamber 20A of the nozzle cover 20 is decompressed through the decompression unit 24, so that the pressure within the decompression chamber 20A is reduced as compared to a pressure at the outside of the nozzle cover 20.

Thereafter, the carbon dioxide gas is supplied from the gas nozzle 50 into the decompression chamber 20A of the nozzle cover 20 as the cleaning gas, and the helium gas is supplied into the decompression chamber 20A of the nozzle cover 20 as the extruding gas.

Figure 6:
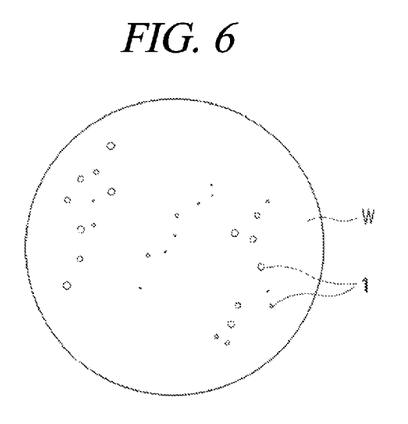
FIG. 6 is a plan view illustrating a surface of a wafer.

In this case, by jetting the carbon dioxide gas as the cleaning gas from the outlet 50a of the gas nozzle 50 into the decompression chamber 20A, a gas cluster can be created in the decompression chamber 20A, and a particle 1 adhering on the wafer W can be removed by using this gas cluster (see FIG. 6).

In the present exemplary embodiment, an ejection amount M1 of the gas for gas curtain jetted from the end portion of the holder support 12 on the nozzle cover 20 side is set to be smaller than an exhaust amount M2 of the gas for gas curtain exhausted from the decompression chamber 20A through the decompression unit 24. By way of example, the ejection amount is set to be M1=10 L/min to 30 L/min, and the exhaust amount is set to be M2=M1×1 to 2 (1 to 2 times the ejection amount).

Here, the principle of removing the particle from the surface of the wafer W using the gas cluster will be described. The gas cluster refers to a substance generated as atoms or molecules of a gas are gathered as an aggregate when the gas is supplied into a processing gas atmosphere from a region having a pressure higher than that of the decompression chamber 20A of the nozzle cover 20 and cooled to a condensation temperature by adiabatic expansion. For example, a processing pressure in the decompression chamber 20A of the nozzle cover 20 is set to be a vacuum atmosphere of, e.g., 0.1 Pa to 100 Pa, and the cleaning gas (carbon dioxide gas) is supplied at a pressure of 0.3 MPa to 5.0 MPa to the gas nozzle 50. When this cleaning gas is supplied into the processing atmosphere of the decompression chamber 20A of the nozzle cover 20, it is cooled to equal to or less than the condensation temperature due to rapid adiabatic expansion. As a result, molecules 2a are combined with each other by a van der Waals force on the outlet 50a side of the gas nozzle 50 to form a gas cluster 2 as the aggregate, as illustrated in FIG. 2 and FIG. 3. The gas cluster 2 is neutral in this example. By way of example, it is desirable that the gas cluster meets the condition of $5 \times 10^3$ atoms (molecules)/cluster or more as it is about 8 nm in terms of $5 \times 10^3$ atoms (molecules)/cluster.

The gas cluster 2 generated on the outlet 50a side of the gas nozzle 50 is vertically radiated toward the wafer W. Then, the gas cluster 2 enters the recess for circuit pattern on the wafer W and removes the particle 1 in the recess by blowing it away.

Figure 4A:
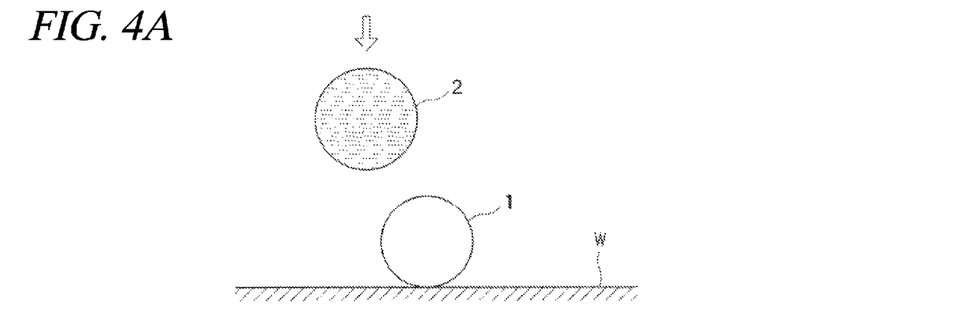
FIG. 4A to FIG. 4D are side views illustrating a state in which a particle is removed by a gas cluster.
Figure 4B:
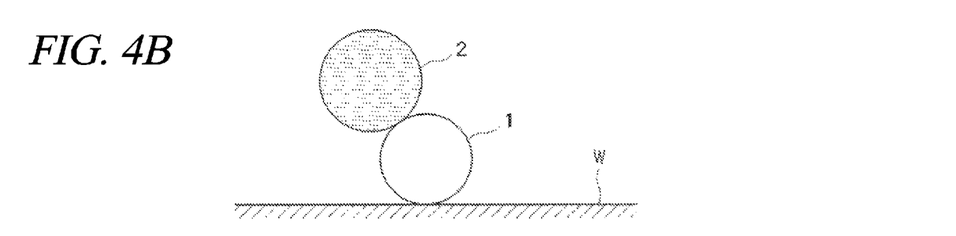
Figure 4C:
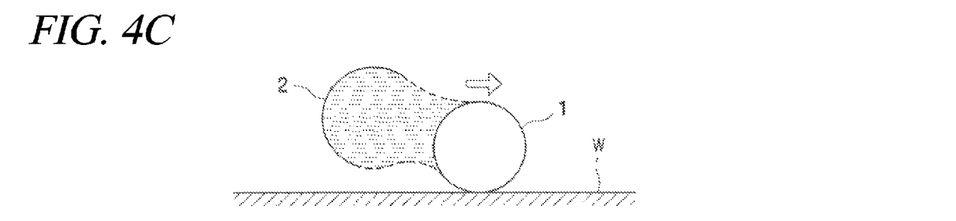
Figure 4D:
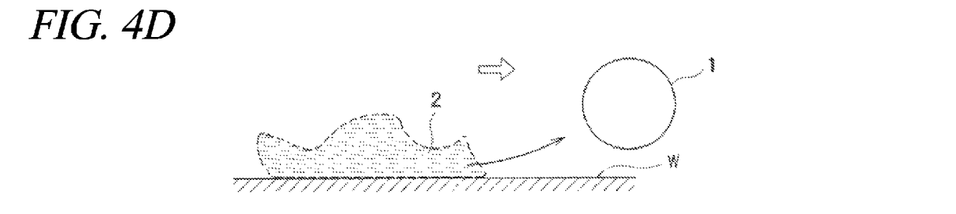

A state in which the particle 1 on the wafer W is removed by the gas cluster 2 is schematically illustrated in FIG. 4A to FIG. 4D and FIG. 5A to FIG. 5D. FIG. 4A to FIG. 4D are diagrams illustrating a case where the gas cluster 2 directly collides with the particle 1 on the wafer W. In this case, the gas cluster 2 is radiated perpendicularly to the surface of the wafer W and is highly likely to collide with the particle 1 from obliquely above it, as illustrated in FIG. 4A. If the gas cluster 2 collides with the particle 1 in the state that it is offset from the particle 1 (that is, in the state that a center of the gas cluster 2 and a center of the particle 1 are deviated when viewed from above) as shown in FIG. 4B, a force that moves the particle 1 in a transversal direction is applied to the particle 1 by an impact at the time of the collision of the gas cluster 2, as shown in FIG. 4C. As a result, the particle 1 is separated from the surface of the wafer W, floats up, and is blown sideways or obliquely upwards, as shown in FIG. 4D.

Figure 5A:
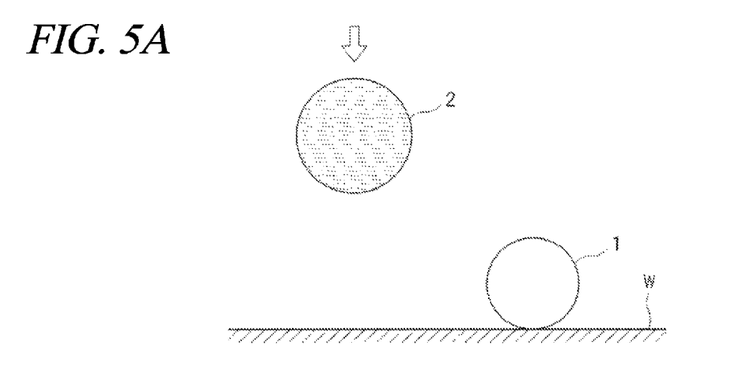
FIG. 5A to FIG. 5D are side views illustrating a state in which a particle is removed by a gas cluster.
Figure 5B:
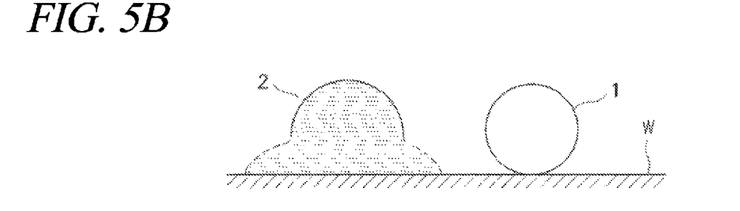
Figure 5C:
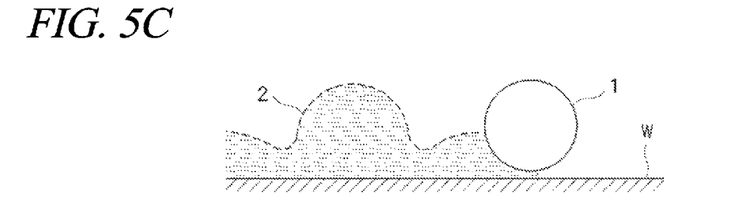
Figure 5D:
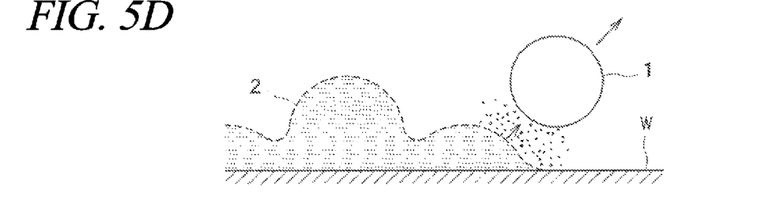

Further, it is also possible to remove the particle 1 by radiating the gas cluster 2 to the vicinity of the particle 1 as shown in FIG. 5A without making the gas cluster 2 directly collide with the particle 1. If the gas cluster 2 collides with the wafer W, the constituent molecules of the gas cluster 2 is decomposed while being spread in a transversal direction (see FIG. 5B). At this time, since a high kinetic energy density region moves in the transversal direction (horizontal direction), the particle 1 is separated from the wafer W to be blown away (see FIG. 5C and FIG. 5D). In this way, the particle 1 escapes from the recess and is dispersed into the decompression chamber 20A of the nozzle cover 20, and is then removed via the decompression unit 24 to the outside through the decompression pump 27 provided outside the cleaning chamber 31.

While the gas cluster 2 is being generated by jetting the carbon dioxide gas and the helium gas from the gas nozzle 50 to the wafer W and removing the particle 1 on the wafer W by using the generated gas cluster, the substrate holder 11 is rotated to rotate the wafer W, and the gas nozzle 50 and the nozzle cover 20 are moved from above the center of the wafer W to above the periphery thereof by the moving arm 17. Thus, the particle 1 on the wafer W can be effectively removed by the gas cluster 2 over the entire region of the wafer W.

In the meantime, when the gas nozzle 50 is located between the center and the periphery of the wafer W (see FIG. 1 and FIG. 2), the gas for gas curtain jetted from the end portion of the holder support 12 on the nozzle cover 20 side forms the gas curtain 20B toward the nozzle cover in a gap G (for example, 0.85 mm) between the holder support 12 and the nozzle cover 20, and thus maintains the inside of the decompression chamber 20A of the nozzle cover 20 in a sealed state.

Subsequently, if the gas nozzle 50 reaches the periphery of the wafer W (see FIG. 3), some of the gas for gas curtain jetted from the end portion of the holder support 12 on the nozzle cover 20 side is jetted to the nozzle cover 20, and the rest of the gas is introduced into the decompression chamber 20A as well. Since, however, a flow rate of the gas for gas curtain introduced into the decompression chamber 20A is small, it does not affect the decompression atmosphere of the decompression chamber 20A.

In this case, the gas for gas curtain jetted from the end portion of the holder support 12 on the nozzle cover 20 side forms the gas curtain 20B in the gap G between the nozzle cover 20 and the end portion of the holder support 12 on the nozzle cover 20 side, thus keeping the inside of the decompression chamber 20A of the nozzle cover 20 in the sealed state.

In the present exemplary embodiment, the holder support 12 is fixed to the holder main body 11A by non-illustrated clamp screws, and the height position of the holder support 12 can be adjusted based on the thickness of the wafer W. In FIG. 3, as the height position of the holder support 12 is adjusted, the top surface of the wafer W becomes on a level with the top surface of the holder main body 11A. Thus, the height of the top surface of the wafer W coincides with the height of the top surface of the holder support 12.

Accordingly, the gap G between the nozzle cover 20 and the end portion of the holder support 12 on the nozzle cover 20 side and the gap between the wafer W and the nozzle cover 20 are made same.

According to the present exemplary embodiment as described above, while rotating the wafer W by the substrate holder 11, the gas nozzle 50 and the nozzle cover 20 are moved by the moving arm 17 from the center of the wafer W toward the periphery thereof. Thus, the particle 1 on the wafer W can be removed by using the gas cluster 2 in the entire region of the wafer W. Further, while keeping the gas nozzle 50 and the nozzle cover 20 on the periphery of the wafer W, the wafer W is rotated by the substrate holder 11. Thus, the particle 1 on the periphery of the wafer W can be removed by using the gas cluster 2.

In addition, by supplying the carbon dioxide gas and the helium gas from the gas nozzle 50 into the decompression chamber 20A of the nozzle cover 20, the gas cluster 2 is generated. The particle 1 on the wafer W is removed by using the gas cluster 2, and the removed particle 1 is sent from the decompression chamber 20A to the outside. For this reason, the particle 1 removed from the wafer W is suppressed from being wound up to adhere to other portions of the wafer W again. Thus, the entire wafer W can be kept clean.

Particularly, the nozzle cover 20 is configured to be movable with respect to the wafer W by the moving arm 17. While removing the particle 1 on the wafer W by using the gas cluster 2, the decompression chamber 20A of the nozzle cover 20 is moved from the center of the wafer W to the periphery thereof. In this case, while the decompression chamber 20A is being moved from the center of the wafer W to the periphery thereof, the nozzle cover 20 covers the entire region of the wafer W all the time, thus suppressing the particle 1 removed from the wafer W from being scattered to the outside of the nozzle cover 20. Thus, the particle 1 can be securely suppressed from being wound up and adhering to the wafer W again.

In addition, in the above-described exemplary embodiment, although the carbon dioxide gas is used as the cleaning gas and the helium gas is used as the extruding gas, the present exemplary embodiment is not limited thereto. By way of example, an argon gas or the like may be used as the cleaning gas, and a hydrogen gas or the like may be used as the extruding gas. When a combination of the carbon dioxide gas and the hydrogen gas is used, a high cleaning effect can be obtained with a relatively low-priced gas.

Furthermore, although the above exemplary embodiment has been described for the example where the gas for gas curtain such as the $N_2$ gas or the air is jetted to the wafer W from the end portion 12A of the holder support 12 on the nozzle cover 20 side, the present exemplary embodiment is not limited thereto, and other gases may be used as long as they do not affect the operation of generating the gas cluster.

Figure 9:
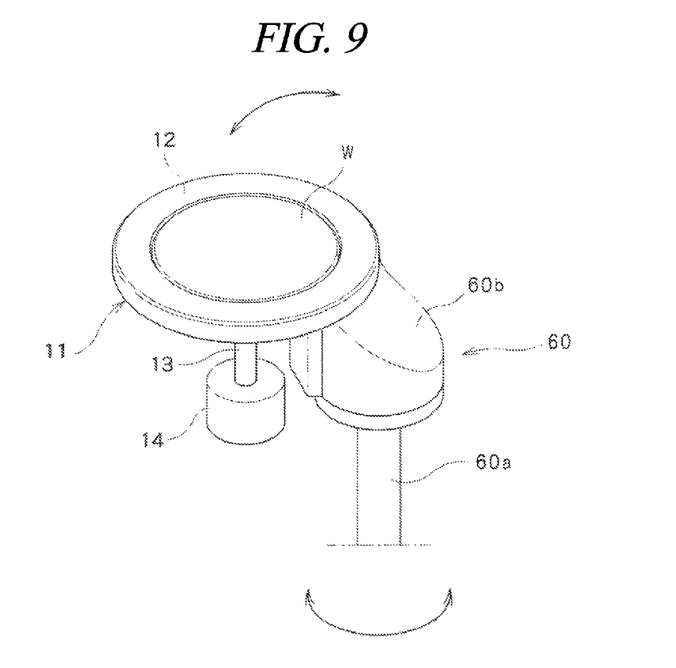
FIG. 9 is a diagram illustrating a modification example of a substrate holder.

Moreover, in the above-described exemplary embodiment, the gas nozzle 50 and the nozzle cover 20 are moved by the moving arm 17 above the wafer W held by the substrate holder 11. However, other configurations may be adopted as long as the gas nozzle 50 and the nozzle cover 20 can be moved relatively above the wafer W. By way of example, as depicted in FIG. 9, a driving mechanism 60 having a driving unit 60a and a driving arm 60b may be provided, and the substrate holder 11 may be connected to the driving arm 60b. In this case, the substrate holder 11 is moved horizontally by the driving mechanism 60 while the wafer W held by the substrate holder 11 is being rotated as the substrate holder 11 is driven by the driving motor 14. Therefore, the entire surface of the wafer W can be cleaned without needing to move the gas nozzle 50 and the nozzle cover 20.

According to the exemplary embodiment, it is possible to suppress the particles removed from the substrate from adhering to the substrate again.

We claim:

1. A substrate cleaning apparatus, comprising:
a substrate holder configured to hold a substrate;
a nozzle cover equipped with a decompression chamber in which a decompressed atmosphere is formed with respect to the substrate; and
a gas nozzle configured to jet a cleaning gas having a pressure higher than that of the decompression chamber to generate, in the decompression chamber, a gas cluster configured to clean the substrate,
wherein the nozzle cover comprises a nozzle cover main body equipped with the decompression chamber and a flange provided at a lower end periphery of the nozzle cover main body, and the substrate holder is provided with a gas curtain forming unit configured to form a gas curtain by jetting a gas for the gas curtain to the flange,
wherein the gas nozzle is configured to be horizontally moved relative to the substrate holder, and the nozzle cover covers an entire region of the substrate while the decompression chamber is being moved from a center of the substrate to a periphery thereof, and
a decompression unit is formed in the nozzle cover and is connected to a decompression pump via a connection line, thereby setting an inside of the decompression chamber to be in the decompressed atmosphere.

2. The substrate cleaning apparatus of claim 1,
wherein the substrate holder comprises a holder main body configured to hold the substrate, and a holder support disposed around the holder main body to surround a periphery of the substrate, and
the gas curtain forming unit is provided at the holder support, and a gas flow path, which communicates with the gas curtain forming unit and is configured to supply the gas for the gas curtain to the gas curtain forming unit, is connected to the substrate holder.

3. The substrate cleaning apparatus of claim 1,
wherein the substrate holder is configured to be rotated, and the gas nozzle and the substrate holder are relatively moved in a horizontal direction.

4. The substrate cleaning apparatus of claim 1,
wherein the substrate holder comprises a holder main body configured to hold the substrate, and a holder support disposed around the holder main body to surround a periphery of the substrate, and
the gas curtain forming unit is provided at the holder support, and a gas flow path, which communicates with the gas curtain forming unit and is configured to supply the gas for the gas curtain to the gas curtain forming unit, is connected to the substrate holder.

5. The substrate cleaning apparatus of claim 4,
wherein the holder support is made of a porous material.

6. The substrate cleaning apparatus of claim 4,
wherein a top surface of the substrate on the holder main body and a top surface of the holder support are on a level with each other.

7. The substrate cleaning apparatus of claim 1,
wherein the substrate holder is configured to be rotated, and the gas nozzle and the substrate holder are relatively moved in a horizontal direction.

8. A substrate cleaning method performed in a substrate cleaning apparatus including a substrate holder configured to hold a substrate and a nozzle cover equipped with a decompression chamber in which a decompressed atmosphere is formed with respect to the substrate, the nozzle cover including a nozzle cover main body equipped with the decompression chamber and a flange provided at a lower end periphery of the nozzle cover main body, the substrate cleaning method comprising:
- forming a gas curtain by jetting a gas for the gas curtain to the flange from a gas curtain forming unit provided at the substrate holder; and
- generating a gas cluster configured to clean the substrate in the decompression chamber by jetting a cleaning gas having a pressure higher than that of the decompression chamber from a gas nozzle,
- wherein the gas nozzle is configured to be horizontally moved relative to the substrate holder, and the nozzle cover covers an entire region of the substrate while the decompression chamber is being moved from a center of the substrate to a periphery thereof, and
- a decompression unit is formed in the nozzle cover and is connected to a decompression pump via a connection line, thereby setting an inside of the decompression chamber to be in the decompressed atmosphere.

* * * * *